United States Patent
Ichikawa et al.

(10) Patent No.: US 12,288,768 B2
(45) Date of Patent: Apr. 29, 2025

(54) METHOD OF MANUFACTURING LAMINATE

(71) Applicant: LINTEC CORPORATION, Tokyo (JP)

(72) Inventors: Isao Ichikawa, Tokyo (JP); Hidekazu Nakayama, Tokyo (JP); Yosuke Sato, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 591 days.

(21) Appl. No.: 17/636,309

(22) PCT Filed: Aug. 20, 2020

(86) PCT No.: PCT/JP2020/031396
§ 371 (c)(1),
(2) Date: Feb. 17, 2022

(87) PCT Pub. No.: WO2021/039565
PCT Pub. Date: Mar. 4, 2021

(65) Prior Publication Data
US 2022/0293555 A1  Sep. 15, 2022

(30) Foreign Application Priority Data
Aug. 26, 2019 (JP) ................. 2019-153524

(51) Int. Cl.
*H01L 23/00* (2006.01)
*B22F 7/08* (2006.01)
(Continued)

(52) U.S. Cl.
CPC ............. *H01L 24/83* (2013.01); *B22F 7/08* (2013.01); *B32B 7/06* (2013.01); *B32B 7/12* (2013.01);
(Continued)

(58) Field of Classification Search
CPC ............. H01L 24/83; B22F 7/08; B32B 7/06
See application file for complete search history.

(56) References Cited

U.S. PATENT DOCUMENTS

| | | | |
|---|---|---|---|
| 2011/0031631 A1* | 2/2011 | Masuko | H01L 24/83 257/774 |
| 2011/0136322 A1* | 6/2011 | Sato | C09J 7/245 438/464 |

(Continued)

FOREIGN PATENT DOCUMENTS

| | | |
|---|---|---|
| JP | 2007-092028 | 4/2007 |
| JP | 2009-170470 | 7/2009 |

(Continued)

OTHER PUBLICATIONS

International Search Report for PCT/JP2020/031396, mailed Oct. 27, 2020, 6 pages.

*Primary Examiner* — Nathan W Ha
(74) *Attorney, Agent, or Firm* — Nixon & Vanderhye P.C.

(57) ABSTRACT

A method of manufacturing a laminate, the method including: providing a film-form firing material on a support sheet, the film-form firing material containing a sinterable metal particle and a binder component and having an identical or substantially identical shape and an identical size to a shape and size of a semiconductor chip; applying, to a substrate, the film-form firing material on the support sheet; peeling off the support sheet from the substrate and the film-form firing material; applying a back surface side of the semiconductor chip to the film-form firing material on the substrate to face each other; and sinter-bonding the semiconductor chip and the substrate by heating the film-form firing material to 200° C. or higher.

14 Claims, 22 Drawing Sheets

(51) Int. Cl.
*B32B 7/06* (2019.01)
*B32B 7/12* (2006.01)
*B32B 15/04* (2006.01)

(52) U.S. Cl.
CPC ........... *B32B 15/04* (2013.01); *B32B 2457/14* (2013.01); *H01L 2224/83101* (2013.01); *H01L 2224/83201* (2013.01); *H01L 2224/8384* (2013.01)

(56) References Cited

U.S. PATENT DOCUMENTS

| | | | | |
|---|---|---|---|---|
| 2011/0159238 | A1* | 6/2011 | Kawamori | C09J 4/06 428/141 |
| 2014/0363925 | A1* | 12/2014 | Schmidt | H01L 21/568 438/119 |
| 2015/0064851 | A1* | 3/2015 | Gallagher | B32B 27/40 428/480 |
| 2015/0371916 | A1* | 12/2015 | Barr | B32B 27/08 428/201 |
| 2016/0017196 | A1* | 1/2016 | Moore | H01L 24/83 526/89 |
| 2016/0043054 | A1* | 2/2016 | Fischer | H01L 24/97 438/107 |
| 2016/0111604 | A1* | 4/2016 | Li | H01L 25/0753 438/107 |
| 2016/0223908 | A1* | 8/2016 | Knapp | G03F 7/0233 |
| 2016/0322327 | A1 | 11/2016 | Hino et al. | |
| 2019/0047081 | A1* | 2/2019 | Kamakura | B23K 20/026 |
| 2020/0058517 | A1* | 2/2020 | Matsumoto | H01L 24/29 |
| 2021/0174984 | A1* | 6/2021 | Ichikawa | H01L 24/83 |
| 2021/0193523 | A1* | 6/2021 | Mita | H01L 21/78 |
| 2021/0242165 | A1* | 8/2021 | Mita | H01L 21/565 |
| 2022/0216114 | A1* | 7/2022 | Tazawa | H01L 21/67 |

FOREIGN PATENT DOCUMENTS

| | | |
|---|---|---|
| JP | 2011-077436 | 4/2011 |
| JP | 2012-059768 | 3/2012 |
| JP | 2013-103959 | 5/2013 |
| JP | 2016-213223 | 12/2016 |
| JP | 2017-224782 | 12/2017 |
| JP | 6327630 | 5/2018 |
| JP | 2018-152403 | 9/2018 |
| JP | 2019-065354 | 4/2019 |

\* cited by examiner

METHOD OF MANUFACTURING LAMINATE

This application is the U.S. national phase of International Application No. PCT/JP2020/031396 filed 20 Aug. 2020 which designated the U.S. and claims priority to JP Patent Application No. 2019-153524 filed 26 Aug. 2019, the entire contents of each of which are hereby incorporated by reference.

TECHNICAL FIELD

The present invention relates to a method of manufacturing a laminate.

The present application claims priority to JP 2019-153524 filed in Japan on Aug. 26, 2019, the contents of which are incorporated herein.

BACKGROUND ART

In recent years, in association with an increase in the voltage and current levels in automobiles, air conditioners, personal computers, and the like, the demand for power semiconductor elements (power devices) installed in these has been increasing. Power semiconductor elements are characteristically used under high voltage and high current conditions, and this is likely to cause a problem of generating heat from the semiconductor element.

To dissipate the heat generated from the semiconductor element, a heat sink has been sometimes attached around the semiconductor element in the art. However, insufficient thermal conductivity at a joint portion between the heat sink and the semiconductor element may hinder efficient heat dissipation.

Examples of a joint material that can form the joint portion with excellent thermal conductivity known in the art include a paste-like metal particulate composition which can be prepared by mixing a heat sinterable metal particle, a polymer dispersant, and a volatile dispersion medium. This composition is a firing material to be sintered to form a solid metal, and this solid metal is believed to be able to constitute the joint portion.

When such a paste-like firing material is used, the paste-like firing material is applied to an object to be sinter-jointed and sintered to form the joint portion. However, it is difficult to apply the material in uniform thickness, and it is difficult to form the joint portion with high thickness stability.

Such a problem can be solved by using a film-form firing material. The joint portion with high stability can be formed by applying a film-form firing material with high thickness stability, which is formed in advance, to an object to be sinter-jointed (e.g., a semiconductor wafer) and sintering.

For such a film-form firing material, for example, those containing a sinterable metal particle and a binder component are disclosed. This film-form firing material is used as a support sheet-attached film-form firing material including a support sheet releasably attached temporarily to one side of the film-form firing material and a release film provided on the other side. In addition, the support sheet is provided with a pressure sensitive adhesive layer on an entire surface or an outer peripheral portion of a substrate film, and the average thickness of the end portion of the film-form firing material, the area of the release film, and the presence or absence of a slit in the release film are configured to satisfy specific conditions (see Patent Document 1). This film-form firing material is used after peeling off the release film and can form the joint portion with excellent thickness stability and thermal conductivity. Furthermore, in this film-form firing material, damage, such as cohesive failure, which is usually apt to occur when the release film is peeled off, is prevented.

CITATION LIST

Patent Literature

Patent Document 1: JP 6327630 B

SUMMARY OF INVENTION

Technical Problem

However, the film-form firing material described in Patent Document 1 is assumed to be applied to an entire back surface of a semiconductor wafer when the film is used. Thus, when the semiconductor wafer is divided into semiconductor chips, this film-form firing material after applied to the semiconductor wafer is to be cut to match the shape and size of the semiconductor chips. The film-form firing material after cutting is finally sintered to form a joint portion for jointing the semiconductor chip and the substrate. However, the film-form firing material containing a large amount of a sinterable metal particle is relatively brittle and thus has caused a problem of easily generating cutting debris when the material is cut and easily broken depending on the cutting method. Furthermore, the semiconductor chip with a defect cannot be used, and thus this has caused a problem of wasting the portion of the film-form firing material applied to this semiconductor chip and reducing the yield of the film-form firing material.

An object of the present invention is to provide a method of manufacturing a laminate, the laminate configured by laminating a semiconductor chip and a substrate via a joint portion, in which the joint portion is formed by sintering a film-form firing material, has excellent thickness stability and thermal conductivity, can prevent damage to the film-form firing material, and provides a good yield of the film-form firing material.

Solution to Problem

The present invention provides a method of manufacturing a laminate, the method including:

providing a film-form firing material on a support sheet, the film-form firing material containing a sinterable metal particle and a binder component and having an identical or substantially identical shape and an identical size to a shape and size of a semiconductor chip to be applied;

applying, to a substrate, the film-form firing material on the support sheet;

peeling off the support sheet from the substrate and the film-form firing material;

applying a back surface side of the semiconductor chip to the film-form firing material on the substrate to face each other; and sinter-bonding the semiconductor chip and the substrate by heating the film-form firing material to 200° C. or higher.

In the method of manufacturing a laminate of the present invention, the method may include sinter-bonding the semiconductor chip and the substrate by applying pressure of 5 MPa or greater to the film-form firing material in addition to heating the film-form firing material to 200° C. or higher.

In the method of manufacturing a laminate of the present invention, the substrate may be a ceramic substrate.

In the method of manufacturing a laminate of the present invention, the support sheet is provided with a substrate film and a pressure sensitive adhesive layer provided on an entire surface on the substrate film, and the film-form firing material may be provided on the pressure sensitive adhesive layer of the support sheet.

In the method of manufacturing a laminate of the present invention, the support sheet is provided with a substrate film and a pressure sensitive adhesive layer provided in a peripheral edge portion on the substrate film, and the film-form firing material may be provided in a region where the pressure sensitive adhesive layer is not provided on the substrate film of the support sheet.

In the method of manufacturing a laminate of the present invention, the pressure sensitive adhesive layer may have energy ray curability.

In the method of manufacturing a laminate of the present invention, the pressure sensitive adhesive layer having energy ray curability may be irradiated with an energy ray and the support sheet is peeled off from the film-form firing material.

In the method of manufacturing a laminate of the present invention, the film-form firing material formed on a release film may be transferred onto the support sheet to provide the film-form firing material on the support sheet.

In the method of manufacturing a laminate of the present invention, the film-form firing material may be formed on the release film by printing.

In the method of manufacturing a laminate of the present invention, the film-form firing material may be formed on the release film by punching using a mold having an identical or substantially identical shape and an identical size to a shape and size of the semiconductor chip to be applied.

In the method of manufacturing a laminate of the present invention, the film-form firing material may be provided on the support sheet by printing.

In the method of manufacturing a laminate of the present invention, the support sheet may be circular.

In the method of manufacturing a laminate of the present invention, the support sheet can be wound into a reel, and the film-form firing materials may be provided side-by-side at regular intervals on the support sheet.

Advantageous Effects of Invention

The present invention provides a method of manufacturing a laminate, the laminate configured by laminating a semiconductor chip and a substrate via a joint portion, in which the joint portion is formed by sintering a film-form firing material, has excellent thickness stability and thermal conductivity, can prevent damage to the film-form firing material, and provides a good yield of the film-form firing material.

DESCRIPTION OF EMBODIMENTS

Method of Manufacturing Laminate

Figure 1A:
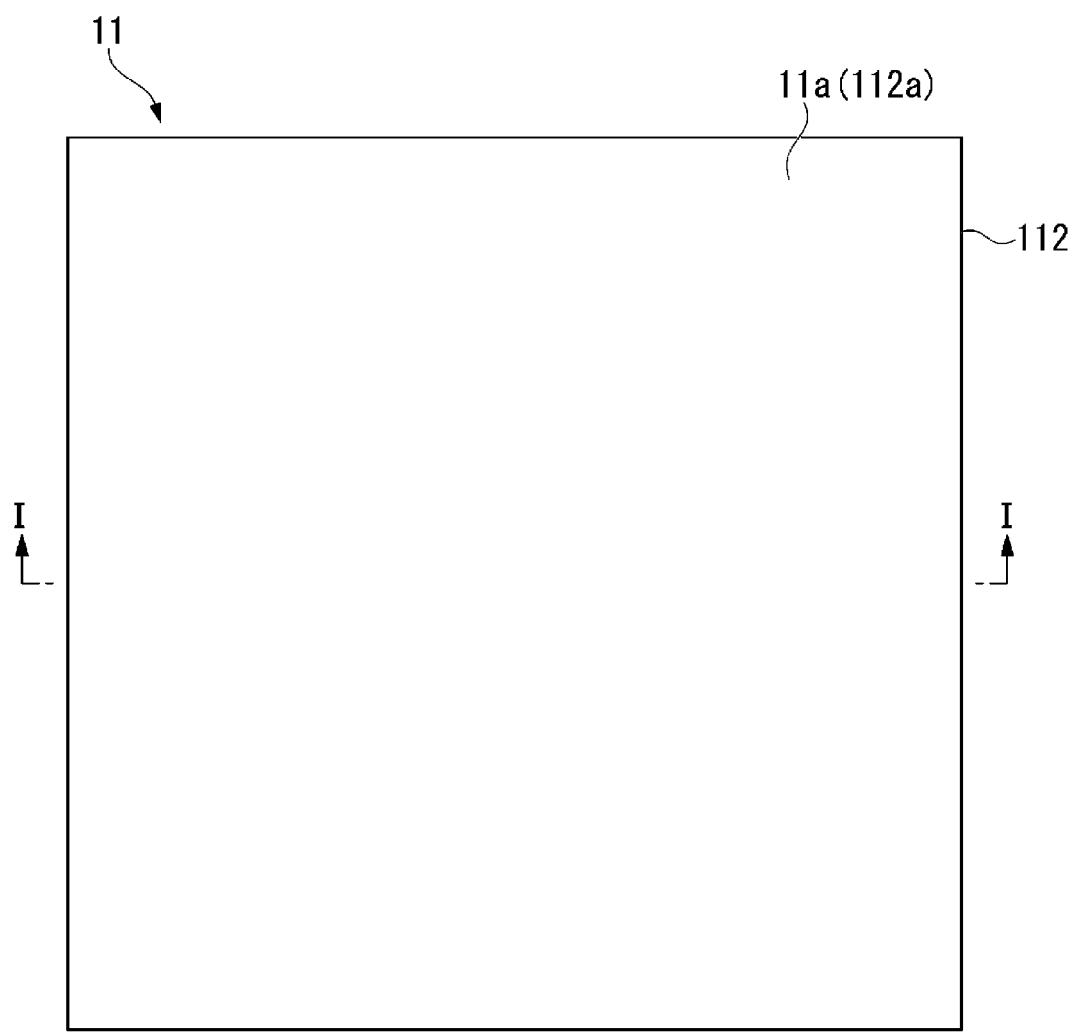
FIG. 1A is a plan view schematically illustrating an example of a support sheet used in a method of manufacturing of the present embodiment.

A method of manufacturing a laminate according to an embodiment of the present invention includes:

providing a film-form firing material on a support sheet, the film-form firing material containing a sinterable metal particle and a binder component and having an identical or substantially identical shape and an identical size to a shape and size of a semiconductor chip to be applied (which may be referred to as "step A" in the present specification);

applying, to a substrate, the film-form firing material on the support sheet (which may be referred to as "step B" in the present specification);

peeling off the support sheet from the substrate and the film-form firing material (which may be referred to as "step C" in the present specification);

applying a back surface side of the semiconductor chip to the film-form firing material on the substrate to face each other (which may be referred to as "step D" in the present specification); and sinter-bonding the semiconductor chip and the substrate by heating the film-form firing material to 200° C. or higher (which may be referred to as "step E" in the present specification).

In the method of manufacturing a laminate of the present embodiment, in step A, the film-form firing material is provided on the support sheet, the film-form firing material having an identical or substantially identical shape and an identical size to a shape and size of a semiconductor chip to be applied, and thus this eliminates the need to cut the film-form firing material to match the shape and size of the semiconductor chip. Thus, this eliminates the generation of cutting debris originating from the film-form firing material even if the film-form firing material is brittle and prevents damage to the film-form firing material. In addition, in step D, a semiconductor chip is applied to the film-form firing material, thus this prevents the use of a semiconductor chip with a defect and ensures that a semiconductor chip free from defect can be applied to the film-form firing material. Thus, this eliminates the waste of the film-form firing material and provides a good yield of the film-form firing material.

Hereinafter, first, the support sheet, the film-form firing material, the semiconductor chip, and the substrate used in the present embodiment will be described.

Support Sheet

Provided that, as for the support sheet, the film-form firing material can be provided on the support sheet and steps B to C described later can be performed, and the support sheet is not particularly limited.

The shape of the support sheet is not particularly limited, but examples include a quadrilateral and a circle. The quadrilateral includes, for example, a square and a rectangle, and the rectangle includes a band-like shape (in other words, an elongated rectangle).

In the present specification, unless otherwise noted, "the shape of the support sheet" means a shape of the support sheet in a planar view (i.e., a planar shape) when the support sheet is looked down from above the main surface (e.g., a first surface described later).

Examples of the support sheet include those provided with a substrate film and a pressure sensitive adhesive layer provided on an entire surface of the substrate film.

Figure 1B:
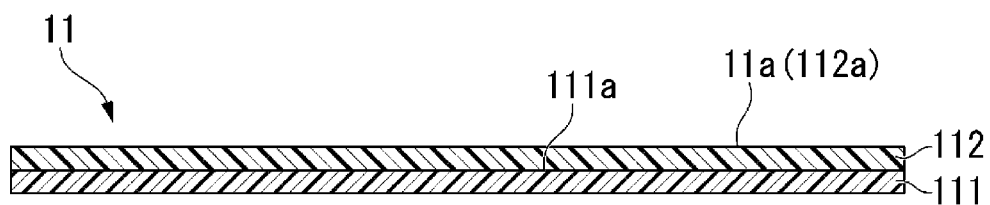
FIG. 1B is a cross-sectional view of the support sheet illustrated in FIG. 1A taken along line I-I in FIG. 1A.

FIG. 1A is a plan view schematically illustrating an example of such a support sheet, and FIG. 1B is a cross-sectional view of the support sheet illustrated in FIG. 1A taken along line I-I in FIG. 1A.

A support sheet 11 illustrated here has a quadrangular shape and is configured to include a substrate film 111 and a pressure sensitive adhesive layer 112 provided on an entire surface of one surface (which may be referred to as the "first surface" in the present specification) 111a of the substrate film 111.

The pressure sensitive adhesive layer 112 suitably facilitates peeling of the support sheet 11 from the film-form firing material in step C described later.

When the support sheet 11 is used, a surface (which may be referred to as the "first surface" in the present specification) 112a of the pressure sensitive adhesive layer 112, the surface opposite from the substrate film 111 side of the pressure sensitive adhesive layer 112, is to be a surface facing the film-form firing material in step A described later. One surface (which may be referred to as the "first surface" in the present specification) 11a of the support sheet 11 is the same as the first surface 112a of the pressure sensitive adhesive layer 112.

Figure 2A:
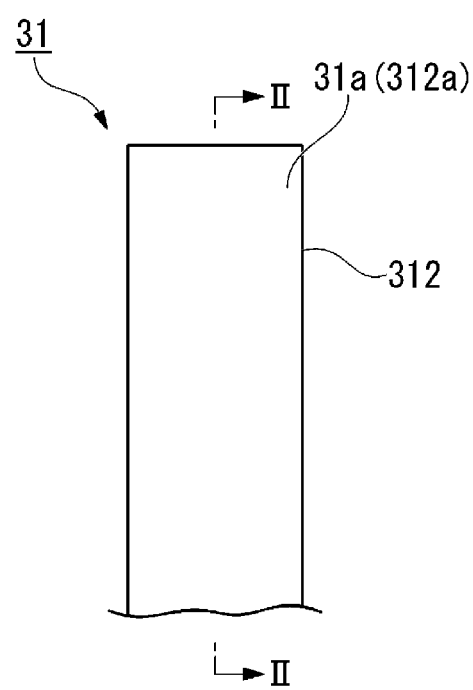
FIG. 2A is a plan view schematically illustrating another example of a support sheet used in a method of manufacturing of the present embodiment.
Figure 2B:
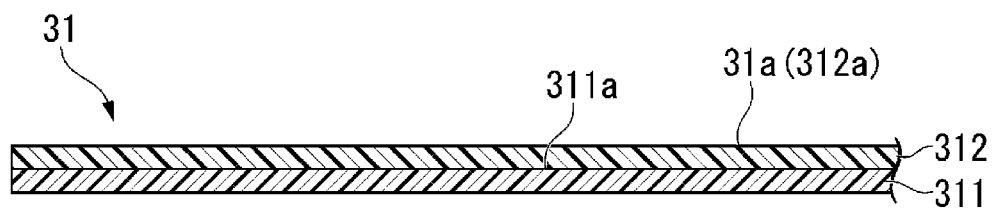
FIG. 2B is a cross-sectional view of the support sheet illustrated in FIG. 2A taken along line II-II in FIG. 2A.

FIG. 2A is a plan view schematically illustrating another example of the support sheet, and FIG. 2B is a cross-sectional view of the support sheet illustrated in FIG. 2A taken along line II-II in FIG. 2A.

In FIG. 2A and figures to follow, the same components as those illustrated in the figures already explained are denoted by the same reference numerals as in the figures already explained, and their detailed explanations will be omitted.

A support sheet 31 illustrated here has a band-like shape and is provided with a substrate film 311 and a pressure sensitive adhesive layer 312 provided on an entire surface of one surface (which may be referred to as the "first surface" in the present specification) 311a of the substrate film 311.

The substrate film 311 is the same as the substrate film 111 illustrated in FIG. 1B except that the shape is different, and the pressure sensitive adhesive layer 312 is the same as the pressure sensitive adhesive layer 112 illustrated in FIG. 1A and FIG. 1B except that the shape is different.

The pressure sensitive adhesive layer 312 suitably facilitates peeling of the support sheet 31 from the film-form firing material in step C described later.

When the support sheet 31 is used, a surface (which may be referred to as the "first surface" in the present specification) 312a of the pressure sensitive adhesive layer 312, the surface opposite from the substrate film 311 side of the pressure sensitive adhesive layer 312, is to be a surface facing the film-form firing material in step A described later. One surface (which may be referred to as the "first surface" in the present specification) 31a of the support sheet 31 is the same as the first surface 312a of the pressure sensitive adhesive layer 312.

Examples of the support sheet also include those provided with a substrate film and a pressure sensitive adhesive layer provided in a peripheral edge portion on the substrate film.

Figure 3A:
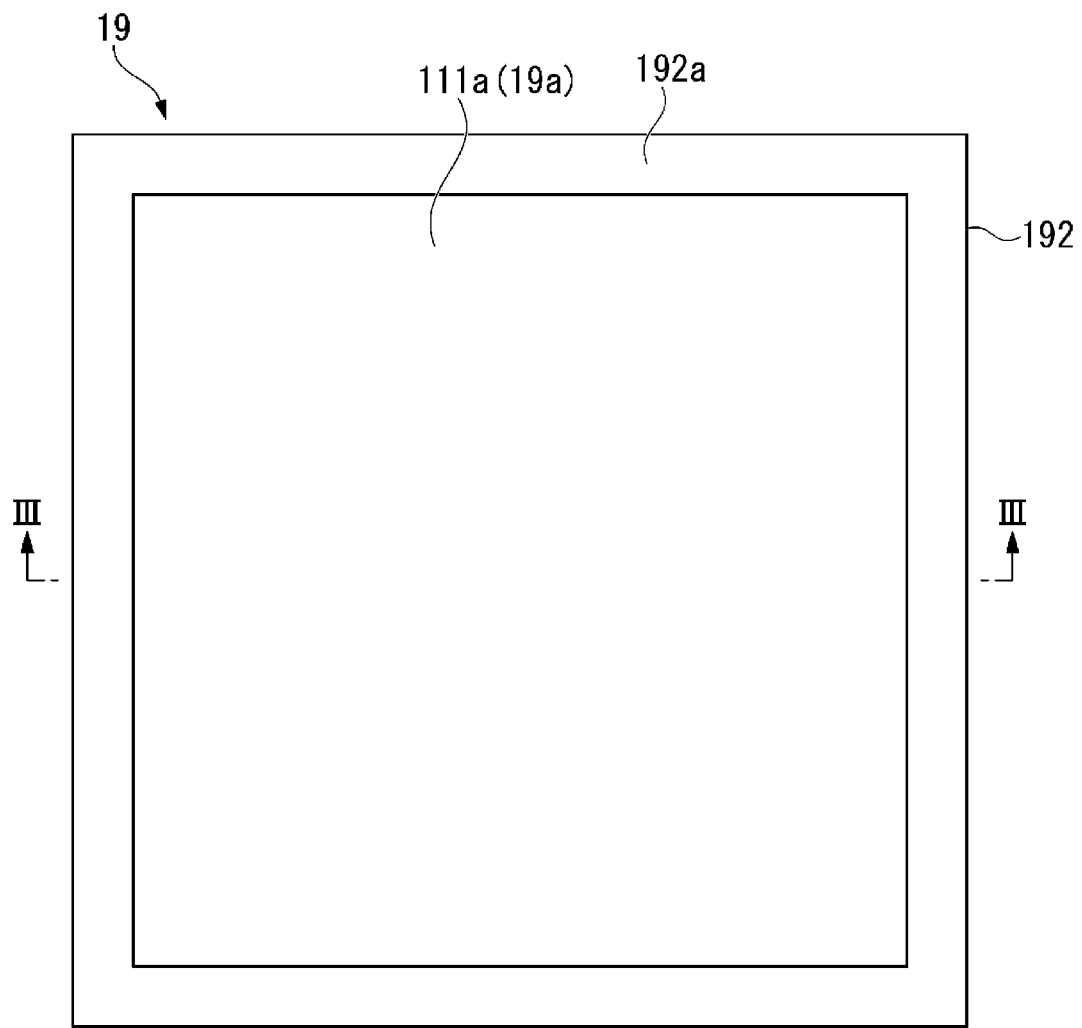
FIG. 3A is a plan view schematically illustrating yet another example of a support sheet used in a method of manufacturing of the present embodiment.
Figure 3B:
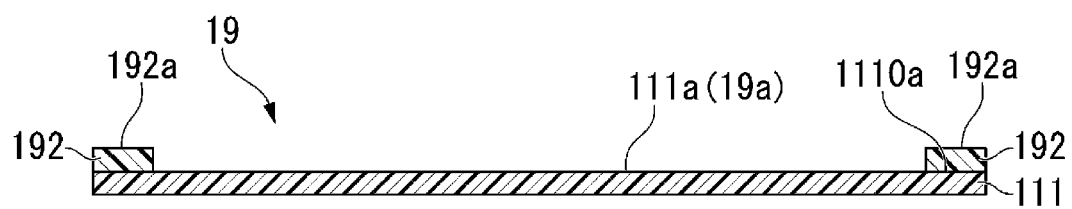
FIG. 3B is a cross-sectional view of the support sheet illustrated in FIG. 3A taken along line in FIG. 3A.

FIG. 3A is a plan view schematically illustrating an example of such a support sheet, and FIG. 3B is a cross-sectional view of the support sheet illustrated in FIG. 3A taken along line in FIG. 3A.

A support sheet 19 illustrated here is configured to include a substrate film 111 and a pressure sensitive adhesive layer 192 provided in a peripheral edge portion 1110a of one surface (first surface) 111a of the substrate film 111.

The peripheral edge portion 1110a of the first surface 111a of the substrate film 111 is a narrow region of the first surface 111a, the narrow region being along the outer peripheral portion of the substrate film 111, and the pressure sensitive adhesive layer 192 has a band-like shape along the outer peripheral portion. In addition, the pressure sensitive adhesive layer 192 is provided continuously in a square ring shape in the peripheral edge portion 1110a.

A first surface 19a of the support sheet 19 is the same as the first surface 111a of the substrate film 111.

The pressure sensitive adhesive layer 192 is, for example, suitably used to bond the support sheet 19 to a support frame to temporality fix the support sheet 19 and to release the support sheet 19 from the support frame in a subsequent step.

The support sheet is preferably provided with a pressure sensitive adhesive layer on an entire surface or in a peripheral edge portion on the substrate film; in other words, the support sheet is preferably provided with a pressure sensitive adhesive layer provided at least in a peripheral edge portion on the substrate film.

Substrate Film

Examples of a constituent material of the substrate film include a resin.

Examples of the resin include polyethylenes, such as low-density polyethylenes (LDPEs) and linear low density polyethylenes (LLDPEs); polyolefins other than polyethylenes, such as polypropylenes, polybutenes, polybutadienes, and polymethylpentenes; ethylene-based copolymers (copolymers having a constituent unit derived from ethylene), such as ethylene-propylene copolymers, ethylene-vinyl acetate copolymers, ethylene-(meth)acrylic acid copolymers, ethylene-methyl (meth)acrylate copolymers, and ethylene-ethyl (meth)acrylate copolymers; polyvinyl chloride; vinyl chloride-vinyl acetate copolymers; polyurethanes; ionomers; polyesters, such as poly(ethylene terephthalate), polybutylene terephthalate), or poly(ethylene naphthalate), having heat resistance; and crosslinked materials of these.

In the present specification, "(meth)acrylic acid" is a concept encompassing both "acrylic acid" and "methacrylic acid". The same applies to terms similar to (meth)acrylic acid, and, for example, "(meth)acrylate" is a concept encompassing both "acrylate" and "methacrylate".

The substrate film may be a weak pressure sensitive adhesive film containing a resin having pressure sensitive adhesion as a constituent material. Such a substrate film is suitable for having the film-form firing material on the substrate film by direct contact with the film in step A described later.

The substrate film may be modified by finishing, such as radiation finishing or discharge finishing.

The substrate film may be composed of one layer (single layer) or multiple layers of two or more. When the substrate film is composed of multiple layers, these multiple layers may be identical to each other or different from each other, and combinations of these multiple layers are not particularly limited.

In the present specification, "multiple layers may be identical to each other or different from each other" means that "all layers may be identical, all layers may be different, or only some layers may be identical", and furthermore, "multiple layers are different from each other" means that "each layer is different from each other in terms of at least one of the constituent material or the thickness", and this is not only the case of the substrate film.

The thickness of the substrate film is not particularly limited and may be, for example, from 30 to 300 μm.

Here, the "thickness of the substrate film" means the thickness of the entire substrate film; for example, the thickness of a substrate film composed of multiple layers means the total thickness of all layers composing the substrate film.

Pressure Sensitive Adhesive Layer

Examples of the pressure sensitive adhesive layer include energy ray-curable pressure sensitive adhesive layers and non-curable weak pressure sensitive adhesive layers.

The energy ray-curable pressure sensitive adhesive layer is cured by irradiation with an energy ray, and the adhesive strength is reduced.

In the present specification, the "energy ray" means an electromagnetic wave or a charged particle beam having an energy quantum, and examples include ultraviolet rays, radiation, and electron beams. The ultraviolet ray can be irradiated by using, for example, a high-pressure mercury lamp, a fusion lamp, a xenon lamp, a black light, or an LED lamp as an ultraviolet ray source. The electron beam can be generated by an electron beam accelerator or the like and irradiated.

In addition, "energy ray-curable" means a property of being cured by irradiation with an energy ray, and "non-curable" means a property of being not cured by any means, such as heating or irradiation with an energy ray.

Examples of the constituent material of the energy ray-curable pressure sensitive adhesive layer include known energy ray-curable pressure sensitive adhesives.

Examples of the constituent materials of the non-curable weak pressure sensitive adhesive layer include general-purpose pressure sensitive adhesives, such as rubber-based pressure sensitive adhesives, acrylic pressure sensitive adhesives, silicone-based pressure sensitive adhesives, urethane-based pressure sensitive adhesives, vinyl ether-based pressure sensitive adhesives, and pressure sensitive adhesives containing a thermal expansion component.

The pressure sensitive adhesive layer with concave-convex morphology on the pressure sensitive adhesive surface can be used as the weak adhesive pressure sensitive adhesive layer.

The non-curable weak pressure sensitive adhesive layer may exhibit an adhesive strength, for example, of 30 to 120 mN/25 mm to a stainless steel plate (SUS plate) at 23° C.

The pressure sensitive adhesive layer may be composed of one layer (single layer) or multiple layers of two or more. When the pressure sensitive adhesive layer is composed of multiple layers, these multiple layers may be identical to each other or different from each other, and combinations of these multiple layers are not particularly limited.

A thickness of the pressure sensitive adhesive layer is not particularly limited and may be, for example, from 1 to 100 μm.

Here, the "thickness of the pressure sensitive adhesive layer" means the thickness of the entire pressure sensitive adhesive layer; for example, the thickness of a pressure sensitive adhesive layer composed of multiple layers means the total thickness of all layers composing the pressure sensitive adhesive layer.

Film-Form Firing Material

A shape of the film-form firing material is identical or substantially identical to a shape of a semiconductor chip to be applied and may be, for example, square or rectangular. In the present specification, unless otherwise noted, the "shape of the film-form firing material" means a shape of the film-form firing material in a planar view (i.e., a planar shape) when the film-form firing material is looked down from above the main surface (e.g., a first surface described later).

A size of the film-form firing material is identical to a size of a semiconductor chip to be applied.

The film-form firing material contains a sinterable metal particle and a binder component and may or may not contain an additional component other than these.

Sinterable Metal Particle

The sinterable metal particles are bonded to each other to form a sintered body upon firing the film-form firing material. The materials placed in contact with the film-form firing material are jointed together via a sintered body of the film-form firing material by firing.

The sinterable metal particle is a particle containing at least a metal element and may be a particle consisting only of a metal element or may be a particle composed of a metallic element and a non-metallic element. Examples of the particle composed of a metallic element and a non-metallic element include metal oxide particles.

Examples of the metal species constituting the sinterable metal particle include silver, gold, copper, iron, nickel, aluminum, silicon, palladium, platinum, and titanium, and the metal species may be a single metal or an alloy of two or more metals.

The metal species constituting one sinterable metal particle may be only one species, or two or more species. When two or more species constitute one sinterable metal particle, the combination and ratio of them can be freely selected.

For example, the metal oxide may be a complex oxide containing two or more metal elements, and examples of such complex oxides include barium titanate.

The sinterable metal particle may not be particularly limited in its particle size as long as the metal particle exhibits sinterability, and the particle size may be, for example, 100 nm or smaller, 50 nm or smaller, and 30 nm or smaller to provide excellent sinterability.

In the present specification, the "particle size of the metal particle" means a diameter of a circle having an area equal to a projected area of the metal particle observed using an electron microscope (projected area equivalent circle diameter).

The particle size of the sinterable metal particle in terms of the number average of the particle diameters determined for particles with the projected area equivalent circle diameter of 100 nm or smaller may be any of from 0.1 to 95 nm, from 0.3 to 50 nm, and from 0.5 to 30 nm. The metal particles to be observed are 100 or more particles randomly selected in one film-form firing material.

The sinterable metal particle is preferably a nano-sized particle, preferably a silver particle, and more preferably a nano-sized silver particle (silver nanoparticle).

In the present specification, the "nano-sized particle" means a particle with a particle size of 100 nm or less.

Binder Component

The binder component is a component for imparting formability and pressure sensitive adhesion to the film-form firing material.

The binder component may be a thermally decomposable binder component, which is thermally decomposed upon firing the film-form firing material.

The binder component is not particularly limited but is preferably a resin.

Examples of the resin include acrylic resins, polycarbonate resins, polylactic acids, and polymers of cellulose derivatives, and acrylic resins are preferred.

Examples of the acrylic resin include homopolymers of a (meth)acrylate compound, copolymers of two or more (meth)acrylate compounds, and copolymers of a (meth)acrylate compound and another monomer.

In the acrylic resin, a content of a constituent unit derived from the (meth)acrylate compound may be, for example, from 50 to 100 mass % relative to the total amount of a constituent unit(s).

Specific examples of the (meth)acrylate compound include alkyl (meth)acrylates, hydroxyalkyl (meth)acrylates, phenoxyalkyl (meth)acrylates, alkoxyalkyl (meth)acrylates, polyalkylene glycol (meth)acrylates, cycloalkyl (meth)acrylates, benzyl (meth)acrylate, and tetrahydrofurfuryl (meth)acrylate.

The acrylic resin is preferably methacrylate. The binder component containing a constituent unit derived from methacrylate enables the film-form firing material to be fired at relatively low temperatures, providing higher joint strength after sintering.

In the acrylic resin, a content of a constituent unit derived from methacrylate may be, for example, from 50 to 100 mass % relative to the total amount of a constituent unit(s).

The another monomer is any compound copolymerizable with the (meth)acrylate compound and is not particularly limited.

Examples of the another copolymerizable monomer include unsaturated carboxylic acids, such as (meth)acrylic acid, vinyl benzoate, maleic acid, and vinyl phthalate; and vinyl group-containing radical polymerizable compounds, such as vinyl benzyl methyl ether, vinyl glycidyl ether, styrene, α-methylstyrene, butadiene, and isoprene.

A weight average molecular weight (Mw) of the resin may be, for example, from 1000 to 1000000. With the weight average molecular weight of the resin within such a range, the film-form firing material has higher strength and better flexibility.

In the present specification, unless otherwise noted, the "weight average molecular weight" is a polystyrene equivalent value measured by gel permeation chromatography (GPC).

A glass transition temperature (Tg) of the resin may be, for example, from −60 to 50° C. The resin with a Tg not lower than the lower limit described above further facilitates peeling off of the support sheet from the film-form firing material described later. The resin with a Tg not higher than the upper limit described above further improves the adhesive strength of the film-form firing material with a semiconductor chip or the like.

When the binder component is thermally decomposable, that is, thermally decomposed upon firing the film-form firing material, the thermal decomposition of the binder component can be confirmed by the mass loss of the binder component upon firing.

In the present embodiment, upon firing the film-form firing material, the entire amount of the binder component may be substantially or completely thermally decomposed, or a portion of the binder component may not be thermally decomposed.

The mass of the binder component after firing may be, for example, 10 mass % or less relative to the mass of the binder component before firing.

Semiconductor Chip

The semiconductor chip may be a known semiconductor chip.

The size of the semiconductor chip (e.g., the area of the semiconductor chip in a planar view when the semiconductor chip is looked down from above its circuit forming surface) may be, for example, from 0.01 to 25 cm² or from 0.25 to 9 cm².

Substrate

The substrate is not particularly limited as long as it can be jointed to a semiconductor chip.

Examples of a preferred substrate include ceramic substrates.

Next, the method of manufacturing a laminate of the present embodiment will be described in detail with reference to drawings.

In figures used in the following descriptions, a main part may be enlarged for convenience to facilitate understanding of features of the present invention, and a dimension ratio or the like of each component is not necessarily identical to the actual one.

First, the method of manufacturing a laminate (which may be referred to as the "first embodiment" in the present specification) will be described by taking an example of using the support sheet 31 illustrated in FIG. 2A and FIG. 2B.

FIG. 4A to FIG. 4E are cross-sectional views for schematically illustrating an example of a method of manufacturing a laminate of the present embodiment.

First Embodiment

Step A

Figure 4A:
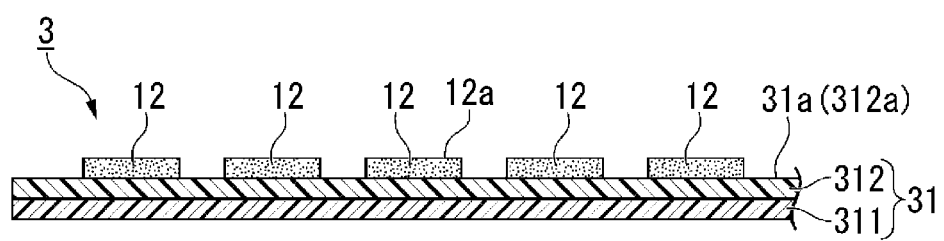
FIG. 4A is a cross-sectional view for schematically illustrating an example of a method of manufacturing a laminate of a first embodiment.

In step A, as illustrated in FIG. 4A, the film-form firing material 12 is provided on the support sheet 31. In the present embodiment, the support sheet thus provided with the film-form firing materials may be referred to as the "support sheet-attached film-form firing material". In FIG. 4A, the support sheet-attached film-form firing material is denoted by reference numeral 3.

As described above, the support sheet 31 is provided with the pressure sensitive adhesive layer 312, and thus, in step A, more specifically, the film-form firing material 12 is provided on the pressure sensitive adhesive layer 312 (the first surface 312a of the pressure sensitive adhesive layer 312) of the support sheet 31.

In step A, as illustrated here, the film-form firing material 12 is preferably brought into direct contact with the first surface 31a of the support sheet 31.

In step A, as illustrated here, preferably a plurality (two or more) of the film-form firing materials 12 is provided on one support sheet 31. In that case, the number of the film-form firing materials 12 provided on one support sheet 31 is preferably from 10 to 10000 and more preferably from 25 to 1000. With the number of the film-form firing materials not less than the lower limit described above, manufacturing efficiency of the laminate is increased. With the number of the film-form firing materials not more than the upper limit described above, a material with a more appropriate size as the support sheet 31 can be used, further improving the work suitability of step A.

Figure 5:
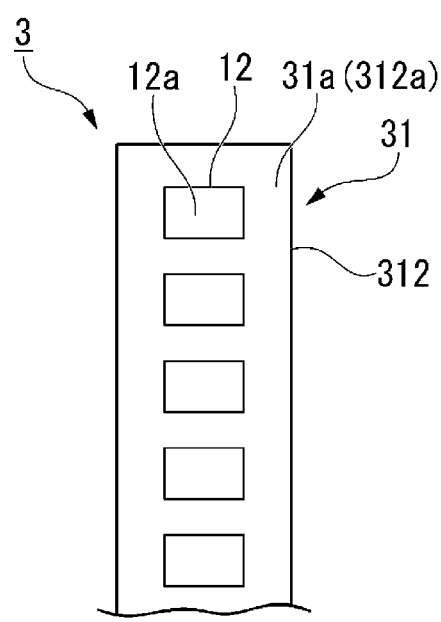
FIG. 5 is a plan view schematically illustrating an example of a support sheet-attached film-form firing material obtained by a method of manufacturing of the first embodiment.

FIG. 5 is a plan view schematically illustrating an example of a support sheet-attached film-form firing material produced by a method of manufacturing of the present embodiment.

The shapes of the support sheet 31 and the support sheet-attached film-form firing material 3 are band-like, and the first surface 31a of the support sheet 31 is provided with two or more film-form firing materials 12 in one row in the longitudinal direction of the support sheet 31.

On the support sheet 31, orientations of all the film-form firing materials 12 are the same, and the film-form firing materials 12 are provided side by side at regular intervals in the longitudinal direction. In addition, the placement positions of all the film-form firing materials 12 are aligned with each other in the direction orthogonal to the longitudinal direction. On the support sheet 31, the film-form firing materials 12 are thus placed in alignment. In FIG. 5, reference numeral 12a denotes a surface (which may be referred to as the "first surface" in the present specification) of the film-form firing material 12, the surface opposite from the support sheet 31 side of the film-form firing material 12.

Step A, in which the film-form firing materials 12 are thus provided side-by-side at regular intervals on the support sheet 31, is an example of a preferred embodiment. In particular, the support sheet 31 can be wound into a reel as described later, and such a support sheet is suitable for providing the film-form firing materials 12 side-by-side at regular intervals.

The support sheet-attached film-form firing material 3 illustrated in FIG. 5 is an example of the support sheet-attached film-form firing material in which the support sheet is band-shaped, and the band-shaped support sheet-attached film-form firing material produced in the present embodiment is not limited to the one illustrated here.

For example, orientations of one or two or more film-form firing materials 12 need not be the same on the support sheet 31. In addition, one or two or more film-form firing materials 12 need not be provided side by side at regular intervals in the longitudinal direction, and the placement positions of one or two or more film-form firing materials 12 need not be aligned with each other in the orthogonal direction to the longitudinal direction.

The number of rows of the film-form firing materials 12 on the support sheet 31 may be other than one (i.e., two or more). When the number of rows is two or more, the film-form firing materials 12 may be provided side-by-side in a lattice pattern on the support sheet 31.

Preferred examples of the method of providing the film-form firing material 12 on the support sheet 31 in step A include a method of providing the film-form firing material 12 on the support sheet 31 by printing (which may be referred to as the "method (A-1)" in the present specification); and a method of providing the film-form firing material 12 on the support sheet 31 by transferring the film-form firing material 12 formed on a release film onto the support sheet 31 (which may be referred to as the "method (A-2)").

As has been known in the art, when a paste-like composition used as a raw material for the film-form firing material 12 is applied using a syringe onto the support sheet 11 and sintered to form a joint portion, it is difficult to produce uniform thickness of the applied composition by controlling the coating amount of the composition. And thus a joint portion with high thickness stability is difficult to form.

In contrast to this, employing the method (A-1) or (A-2) described above enables the film-form firing material 12 with high thickness stability to be provided on the support sheet 31 (here, more specifically the first surface 31a of the support sheet 31), and as a result, a joint portion formed from the film-form firing material 12 also maintains high thickness stability in step E described later. In particular, when the method (A-2) is employed, the film-form firing material 12 with high thickness stability is formed in advance on a release film. And thus transferring this film-form firing material 12 as is enables the film-form firing material 12 with higher thickness stability to be provided on the support sheet 31.

In the present specification, "with high thickness stability" with regard to the film-form firing material and the joint portion formed from the film-form firing material means that these have high thickness uniformity.

Examples of the method of forming the film-form firing material 12 on a release film in the method (A-2) include: a method of forming the film-form firing material 12 on the release film by printing; and a method of forming the film-form firing material 12 on the release film by punching using a mold having an identical or substantially identical shape and an identical size to a shape and size of the semiconductor chip to be applied.

Examples of the method of printing the film-form firing material 12 on the support sheet 31 in the method (A-1) and the method of printing the film-form firing material 12 on the release film in the method (A-2) include known printing methods. Examples of the printing method more specifically include letterpress printing methods, such as flexographic printing methods; intaglio printing methods, such as gravure printing methods; lithographic methods, such as offset printing methods; screen printing methods, such as silk screen printing methods and rotary screen printing methods; and printing methods using a printer of various types, such as inkjet printing methods.

Step B

Step B is performed after step A.

Figure 4B:
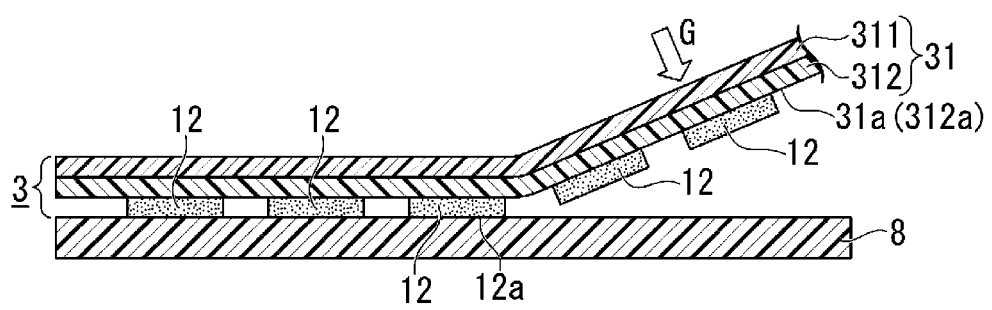
FIG. 4B is a cross-sectional view for schematically illustrating an example of the method of manufacturing a laminate of the first embodiment.

In step B, as illustrated in FIG. 4B, the film-form firing material 12 on the support sheet 31 is applied to a substrate 8.

The film-form firing material 12 can be applied to the substrate 8 by bringing first surface 12a of the film-form firing material into contact with the substrate 8.

Arrow G in FIG. 4B indicates a moving direction of the film-form firing material 12 when the film-form firing material 12 is applied to the substrate 8.

Here, FIG. 4B illustrates a state of step B in a phase where the application of some of the film-form firing materials 12 to the substrate 8 has not been completed.

The band-shaped support sheet 31 is suitable for storing by winding one sheet (one strip) of the sheet into a reel in a state of being further provided with a protective film on the first surface 12a of the film-form firing material 12 as described later. In using the support sheet 31 thus wound into a reel, the support sheet 31 is unwound from the reel, then the protective film is peeled off from the first surface 12a of the film-form firing material 12, and the first surface 12a is brought into contact with the substrate 8 thus the film-form firing material 12 is applied on the support sheet 31 to the substrate 8.

The method of storing the support sheet will be described in detail later.

In step B, as illustrated here, some or all of the film-form firing materials 12 on the support sheet 31 are preferably applied to the substrate 8 at different times from each other; for example, the film-form firing materials 12 may be sequentially applied to the substrate 8 starting with the film-form firing material 12 placed closest to one end side of the support sheet 31 (i.e., the film-form firing material 12 placed on the leftmost side in FIG. 4B) to the film-form firing material 12 placed closest to the other end side of the support sheet 31 (i.e., the film-form firing material 12 farthest on the support sheet 31 from the film-form firing material 12 placed on the leftmost side in FIG. 4B). In step B, all the film-form firing materials 12 on the support sheet 31 may be simultaneously or substantially simultaneously applied to the support sheet 8, but the method of applying the film-form firing materials 12 to the substrate 8 at different times as described above is advantageous in terms of easier handling of the band-shaped support sheet-attached film-form firing material 3.

Step C

Step C is performed after step B.

Figure 4C:
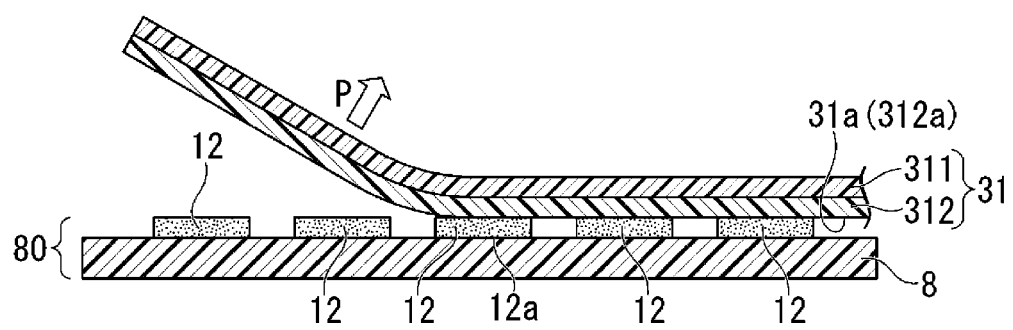
FIG. 4C is a cross-sectional view for schematically illustrating an example of the method of manufacturing a laminate of the first embodiment.

In step C, as illustrated in FIG. 4C, the support sheet 31 is peeled off from the substrate 8 and the film-form firing material 12. When the support sheet 31 is peeled off, the film-form firing material 12 and the substrate 8 remain in a state of being bonded to each other and integrated. In the present embodiment, one thus including a substrate and a film-form firing material provided on a surface (circuit forming surface) of the substrate may be referred to as the "film-form firing material-attached substrate". In FIG. 4C, the film-form firing material-attached substrate is denoted by reference numeral 80. Arrow P in FIG. 4C indicates a direction in which the support sheet 31 is peeled off.

Here, FIG. 4C illustrates a state of step C in a phase where the peeling off of some portions of the support sheet 31 from the film-form firing material-attached substrate 80 has not been completed.

The support sheet 31 can be peeled off from the film-form firing material-attached substrate 80 by applying a force to the support sheet 31 in a direction away from the film-form firing material 12.

In step C, as illustrated here, some or all the regions of the support sheet 31 are preferably peeled off from the film-form firing material-attached substrate 80 at different times from each other; for example, the support sheet 31 may be sequentially peeled off from the film-form firing material-attached substrate 80 starting with one end side of the support sheet 31 (i.e., the left end of the support sheet 31 in FIG. 4C) to the other end the support sheet 31 (i.e., the end of the support sheet 31 not the left side in FIG. 4C). In step C, all the regions of the support sheet 31 may be simultaneously or substantially simultaneously peeled off from the film-form firing material-attached substrate 80, but the method of peeling off the support sheet 31 from the film-form firing material-attached substrate 80 at different times as described above is advantageous in terms of easier handling of the band-shaped support sheet 31.

For the support sheet 31 provided with the substrate film 311 and the pressure sensitive adhesive layer 312, the pressure sensitive adhesive layer 312 having energy ray-curability, as previously described, in step C, the pressure sensitive adhesive layer 312 is irradiated with an energy ray, and the support sheet 31 (here, more specifically a cured product of the pressure sensitive adhesive layer 312) is preferably peeled off from the film-form firing material 12. In this case, curing the pressure sensitive adhesive layer 312 by irradiation with an energy ray reduces the adhesive strength between the cured product of the pressure sensitive adhesive layer 312 and the film-form firing material 12 and thus enables the support sheet 31 to be more easily peeled off from the film-form firing material-attached substrate 80.

In the present embodiment, the peeling off of the support sheet 31 from the film-form firing material-attached substrate 80 by step C may be initiated at or after the application of the film-form firing materials 12 on the support sheet 31 to the substrate 8 by step B is completed for all the film-form firing materials 12; or the peeling off of the support sheet 31 from the film-form firing material-attached substrate 80 by step C may be initiated before the application of the film-form firing materials 12 on the support sheet 31 to the substrate 8 by step B is completed for all the film-form firing materials 12. The latter can shorten the manufacturing time of the laminate, the target product to be manufactured.

Step D

Step D is performed after step C.

Figure 4D:
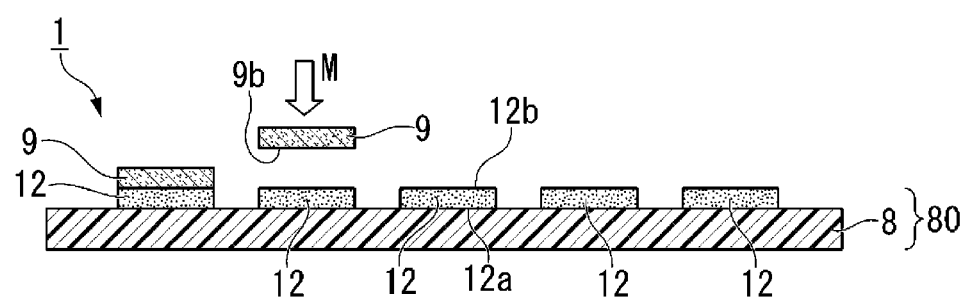
FIG. 4D is a cross-sectional view for schematically illustrating an example of the method of manufacturing a laminate of the first embodiment.

In step D, as illustrated in FIG. 4D, a back surface 9b side of the semiconductor chip 9 is applied to the film-form firing material 12 on the substrate 8 (in other words, the film-form firing material 12 in the film-form firing material-attached substrate 80) to face each other. Arrow M in FIG. 4D indicates a moving direction of the semiconductor chip 9 when the semiconductor chip 9 is applied to the film-form firing material 12 (film-form firing material-attached substrate 80).

Here, FIG. 4D illustrates a state of step D in a phase where the application of some of the semiconductor chips 9 to the film-form firing material-attached substrate 80 has not been completed.

In FIG. 4D, reference numeral 12b denotes a surface (which may be referred to as the "second surface" in the present specification) of the film-form firing material 12, the surface opposite from the first surface 12a of the film-form firing material 12, and this is also the application surface of the semiconductor chip 9. Here, the second surface 12b of the film-form firing material 12 and the back surface 9b of the semiconductor chip 9 are bonded together.

For the application of the semiconductor chip 9 to the film-form firing material-attached substrate 80, a known method of fixing and moving a semiconductor chip, such as, for example, a method using a collet, can be employed.

In step D, the semiconductor chip 9 is applied to the film-form firing material-attached substrate 80, thus this prevents the use of a semiconductor chip with a defect and ensures that a semiconductor chip 9 free from defect can be applied to the film-form firing material-attached substrate 80. Thus, this eliminates the waste of the film-form firing material 12 and the film-form firing material-attached substrate 80 and provides good yields of the film-form firing material 12 and the film-form firing material-attached substrate 80.

Step E

Step E is performed after step D.

Figure 4E:
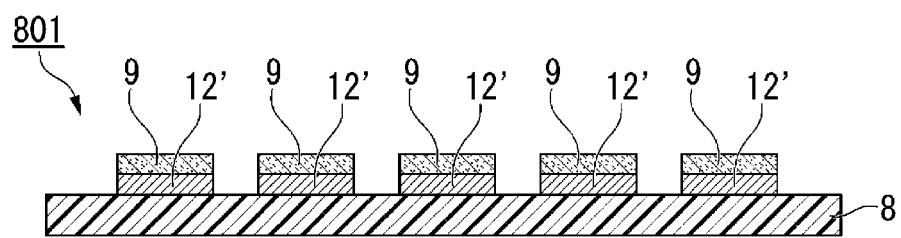
FIG. 4E is a cross-sectional view for schematically illustrating an example of the method of manufacturing a laminate of the first embodiment.

In step E, the film-form firing material 12 is heated to 200° C. or higher to sinter-bond the semiconductor chip 9 and the substrate 8 as illustrated in FIG. 4E.

By performing step E, firing of the film-form firing material 12 results in formation of the joint portion 12' from the film-form firing material 12 and thus a laminate 801 having a configuration in which the semiconductor chips 9 and the substrate 8 are laminated via the joint portions 12' is provided.

In step E, the upper limit of the heating temperature of the film-form firing material 12 is not particularly limited. For example, from the viewpoint of prevention of damage due to heating to wirings formed on the surfaces of the semiconductor chips 9, the heating temperature of the film-form firing material 12 is preferably 500° C. or lower. On the other hand, heating at a temperature not lower than the lower limit described above further improves the degree of firing of the film-form firing material 12.

In step E, the time duration for heating the film-form firing material 12 can be appropriately selected in consideration of the type of the film-form firing material 12 and the heating temperature but is preferably from 1 to 60 minutes. With the time duration for heating not shorter than the lower limit of the time duration described above, the degree of firing of the film-form firing material 12 is further improved. With the time duration for heating not longer than the upper limit of the time duration described above, excessive heating is prevented.

In step E, in addition to heating the film-form firing material 12, the film-form firing material 12 may be pressurized as well. Such a procedure can further improve the joint strength of the semiconductor chip 9 and the substrate 8 and the strength of the joint portion 12' themselves.

The pressure to the film-form firing material 12 at this time may be applied from the substrate 8 side, from the semiconductor chip 9 side, or from both the substrate 8 side and the semiconductor chip 9 side.

The pressure during the pressurization of the film-form firing material 12 is not particularly limited but is preferably 5 MPa or higher. The pressure in such a range further increases the effect obtained by the pressurization.

That is, in step E, in addition to heating the film-form firing material 12 to 200° C. or higher, pressurizing the film-form firing material 12 at 5 MPa or higher may be performed to sinter-bond the semiconductor chips 9 and the substrates 8.

In step E, the upper limit of the pressure in pressurizing as well as heating the film-form firing material 12 is not particularly limited. For example, from the perspective of prevention of damage to the substrate 8, particularly the substrate 8 that is a ceramic substrate, the pressure is preferably 50 MPa or lower.

In the present embodiment, the joint portion 12' is formed from the film-form firing material 12 and thus has excellent thickness stability and thermal conductivity. In addition, the film-form firing material 12 has an identical or substantially identical shape and an identical size to a shape and size of the semiconductor chip 9, and thus this eliminates the need to cut the film-form firing material 12 to the shape and size of the semiconductor chip 9. Thus, this eliminates the generation of cutting debris originating from the film-form firing material 12 even if the film-form firing material 12 is brittle, prevents damage to the film-form firing material 12, and forms a joint portion 12' free from damage.

The laminate 801 is suitable for constituting a power semiconductor element (power device).

The method of manufacturing of the present embodiment is not limited to those described so far and may be those in which one or some configurations are changed or deleted, or those in which another or other configurations are further added to those described so far within a scope not departing from the gist of the present invention. More specifically, those are as follows.

Figure 6:
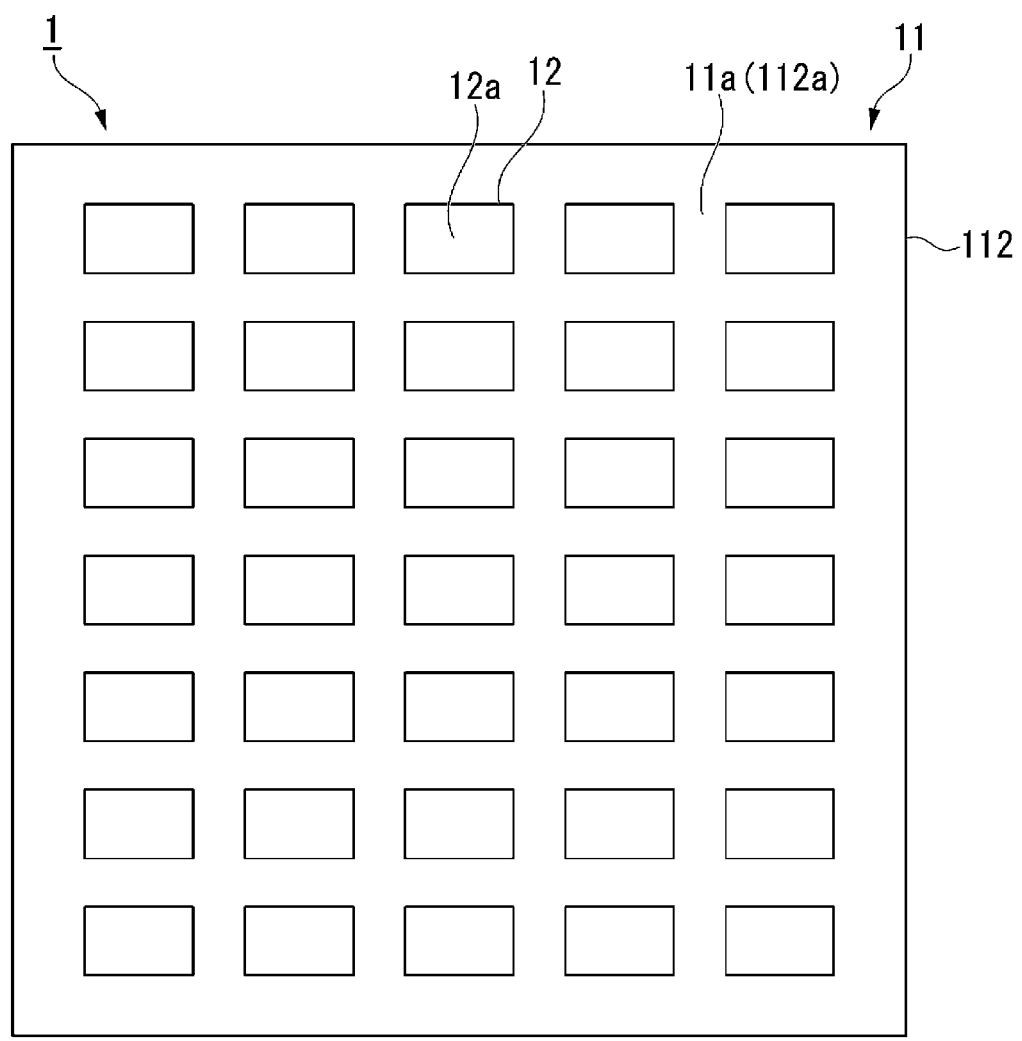
FIG. 6 is a plan view schematically illustrating another example of a support sheet-attached film-form firing material obtained by a method of manufacturing of the first embodiment.

The present embodiment has been described so far for the method of manufacturing a laminate in which the shape of the support sheet is band-like, but the shape of the support sheet used in the present embodiment may be a quadrilateral other than a band-like shape. FIG. 6 is a plan view schematically illustrating an example of the support sheet-attached film-form firing material in that case.

The shapes of the support sheet 11 and the support sheet-attached film-form firing material 1 illustrated here are quadrangular, and the first surface 11a of the support sheet 11 is provided with a total of 35 film-form firing materials 12 in five rows and seven rows in two orthogonal directions.

In addition, on the support sheet 11, all the film-form firing materials 12 are oriented in the same way, and the film-form firing materials 12 are placed in alignment so that the placement positions of the adjacent film-form firing materials 12 are aligned with each other in the two orthogonal directions described above. That is, the film-form firing materials 12 are provided side-by-side in a lattice pattern on the support sheet 11.

Step A, in which the film-form firing materials 12 are thus provided side-by-side in a lattice pattern on the support sheet 11, is an example of a preferred embodiment.

The placement pattern of the film-form firing materials 12 on the support sheet 11 illustrated in FIG. 6 is the same as the placement pattern of the film-form firing materials 12 on the support sheet 31 except that the number of rows of the film-form firing materials 12, the number of the film-form firing materials 12 per row, and the total number of the film-form firing materials 12 are different.

In FIG. 6, the film-form firing materials 12 are provided side-by-side in a lattice pattern on the support sheet 11, but the placement pattern of the film-form firing materials 12 on the support sheet 11 is not limited to this. For example, orientations of one or two or more film-form firing materials 12 need not be the same, and for one or two or more film-form firing materials 12, the placement positions of adjacent film-form firing materials 12 need not be aligned with each other in the two orthogonal directions described above.

In FIG. 6, the number of the film-form firing materials 12 provided on the support sheet 11 is 35, but the number is not limited to this. For example, the number may be from 5 to 10000.

The method of manufacturing a laminate using the support sheet 11 is the same as the method of manufacturing a laminate described above except that the support sheet 11 is used instead of the support sheet 31.

Figure 7:
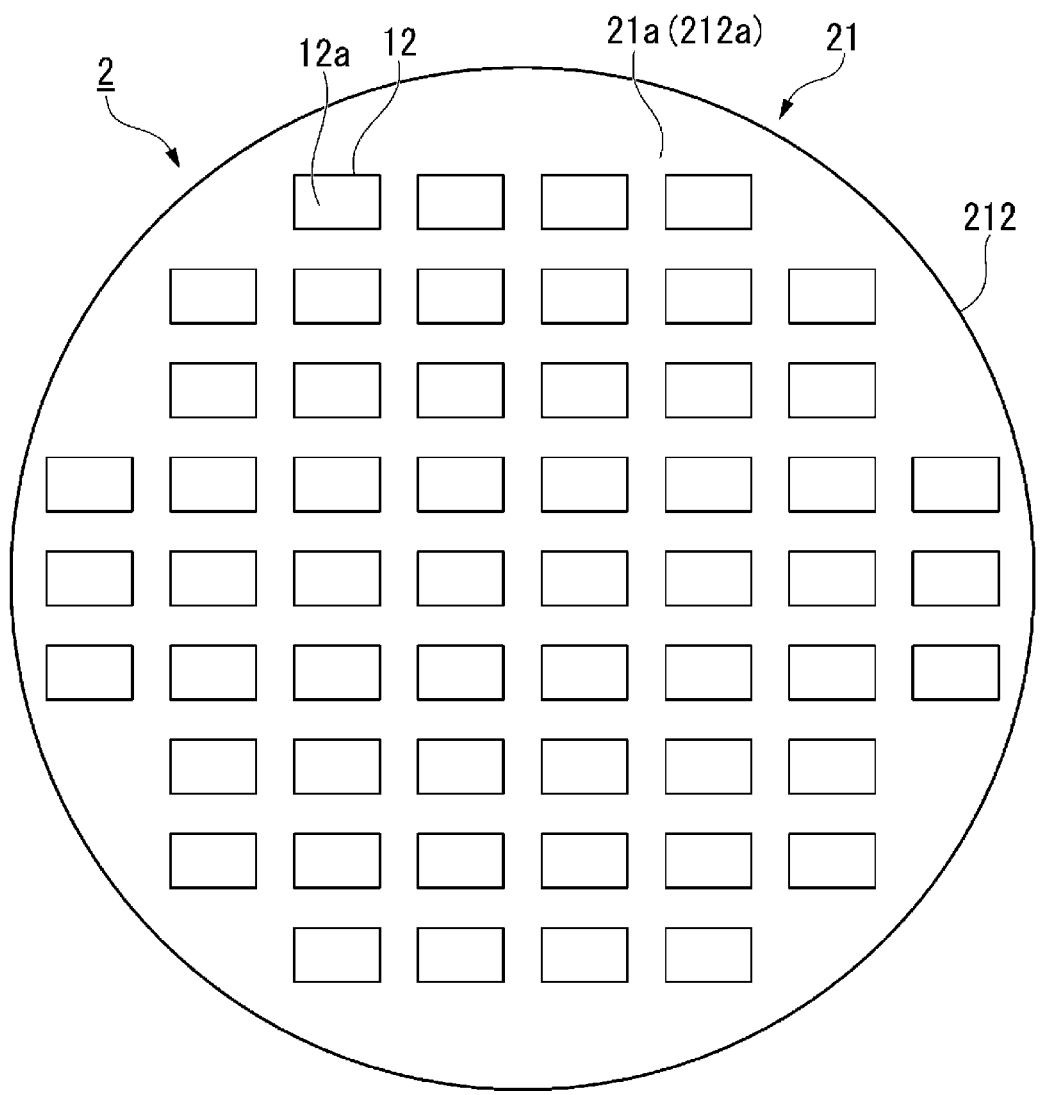
FIG. 7 is a plan view schematically illustrating yet another example of a support sheet-attached film-form firing material obtained by a method of manufacturing of the first embodiment.

The shape of the support sheet used in the present embodiment may be circular. FIG. 7 is a plan view schematically illustrating an example of the support sheet-attached film-form firing material in that case.

The shapes of the support sheet 21 and the support sheet-attached film-form firing material 2 illustrated here are circular, and the first surface 21a of the support sheet 21 is provided with a total of 56 film-form firing materials 12 in four to eight rows and three to nine rows in two orthogonal directions.

The placement pattern of the film-form firing materials 12 on the support sheet 21 illustrated in FIG. 7 is the same as the placement pattern of the film-form firing materials 12 on the support sheet 11 except that the number of rows of the film-form firing materials 12, the number of the film-form firing materials 12 per row, and the total number of the film-form firing materials 12 are different.

A pressure sensitive adhesive layer 212 in the support sheet 21 is the same as the pressure sensitive adhesive layer 112 in the support sheet 11 except that the shape is circular, and a substrate film (not illustrated) in the support sheet 21 is the same as the substrate film 111 in the support sheet 11 except that the shape is circular.

A surface (which may be referred to as the "first surface") 212a of the pressure sensitive adhesive layer 212, the surface opposite from the substrate film side of the pressure sensitive adhesive layer 212, is the same as the first surface 21a of the support sheet 21.

The support sheet-attached film-form firing material 2 illustrated in FIG. 7 is an example of the support sheet-attached film-form firing material in which the support sheet is circular, and the circular support sheet-attached film-form firing material produced in the present embodiment is not limited to the one illustrated here.

For example, for the circular support sheet-attached film-form firing material, the placement pattern, such as the orientation, placement position, and number of rows of the film-form firing materials, the number of the film-form firing materials per row, and the total number of the film-form firing materials on the support sheet, can be freely set according to the purpose.

The method of manufacturing a laminate using the support sheet 21 is the same as the method of manufacturing a laminate described above except that the support sheet 21 is used instead of the support sheet 31.

In the present embodiment, when the support sheet 11 is used, in one or both of step A and step B, the support sheet 11 can be temporarily fixed to a support frame (not illustrated) by bonding the peripheral edge of the pressure sensitive adhesive layer 112 (more specifically, the first surface 112a of the pressure sensitive adhesive layer 112) in the support sheet 11 to the support frame. In that case, the top portion of the peripheral edge of the first surface 112a of the pressure sensitive adhesive layer 112 is left open to avoid hindrance of bonding of the pressure sensitive adhesive layer 112 to the support frame. Here, the peripheral edge portion of the first surface 112a of the pressure sensitive adhesive layer 112 is a narrow region of the first surface 112a of the pressure sensitive adhesive layer 112, the narrow region along the outer peripheral portion of the pressure sensitive adhesive layer 112, similarly to the peripheral edge portion 1110a of the first surface 111a of the substrate film 111 previously described.

The same is true when the support sheet 21 is used. That is, in the present embodiment, when the support sheet 21 is used, in one or both of step A and step B, the support sheet 21 can be temporarily fixed to a support frame (not illustrated) by bonding the peripheral edge of the pressure sensitive adhesive layer 212 (more specifically, the first surface 212a of the pressure sensitive adhesive layer 212) in the support sheet 21 to the support frame. In that case, the top portion of the peripheral edge of the first surface 212a of the pressure sensitive adhesive layer 212 is left open to avoid hindrance of bonding of the pressure sensitive adhesive layer 212 to the support frame. Here, the peripheral edge portion of the first surface 212a of the pressure sensitive adhesive layer 212 is similar to that of the pressure sensitive adhesive layer 112 described above and is a narrow region of the first surface 212a of the pressure sensitive adhesive layer 212, the narrow region along the outer peripheral portion of the pressure sensitive adhesive layer 212.

In the present embodiment, the support sheet-attached film-form firing material produced by performing step A is suitable for storage.

For example, a support sheet-attached film-form firing material further provided with a protective film on the first surface of the film-form firing material is particularly suitable for storage.

That is, the method of manufacturing of the present embodiment may include between step A and step B:

applying a protective film to a surface (first surface) of the film-form firing material, the surface opposite from the support sheet side of the film-form firing material (which may be referred to as "step F1" in the present specification);

storing the support sheet and film-form firing material (the support sheet-attached film-form firing material) after application of the protective film (which may be referred to as "step F2" in the present specification); and peeling off the protective film from the film-form firing material on the support sheet to which the protective film has been attached after storage (the support sheet-attached film-form firing material after storage) (which may be referred to as "step F3" in the present specification).

The protective film is for protecting the film-form firing material in the support sheet-attached film-form firing material. Examples of the protective film include those similar to the release film previously exemplified.

Figure 8:
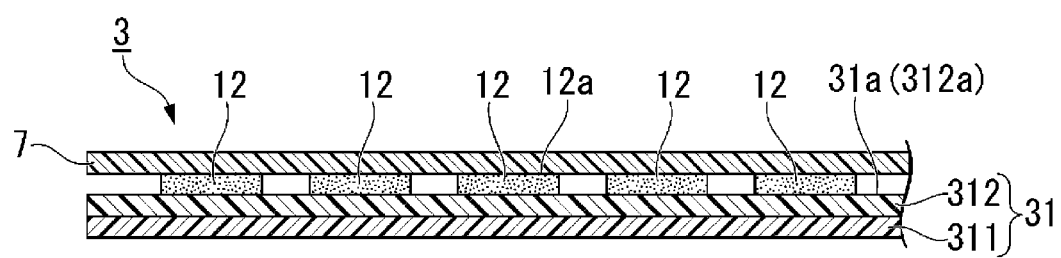
FIG. 8 is a cross-sectional view schematically illustrating an example of a support sheet-attached film-form firing material provided with a protective film obtained by a method of manufacturing of the first embodiment.

FIG. 8 is a cross-sectional view schematically illustrating an example of a support sheet-attached film-form firing material provided with a protective film in which the support sheet 31 is used.

The support sheet-attached film-form firing material 3 illustrated here is provided with the protective film 7 on the first surfaces 12a of the film-form firing materials 12. The shape and size of the protective film 7 are not particularly limited as long as the protective film 7 can cover the first surfaces 12a of all the film-form firing materials 12 in the support sheet-attached film-form firing material 3; for example, the shape (planar shape) of the protective film 7 may be identical to the shape (planar shape) of the support sheet 31 to improve the handleability of the support sheet-attached film-form firing material 3 in a state where the protective film 7 is provided.

The support sheet-attached film-form firing material provided with a protective film also has a similar structure, except for the shape, to that of the support sheet-attached film-form firing material 3 provided with a protective film, in the case where the shape of the support sheet is not band-shaped as in the case of the support sheet 31, but is quadrilateral as in the case of the support sheet 11 or circular as in the case of the support sheet 21.

When the support sheet-attached film-form firing material provided with a protective film has a quadrilateral-shaped or circle-shaped support sheet (e.g., the support sheet-attached film-form firing material 1 or the support sheet-attached film-form firing material 2), a plurality of the support sheet-attached film-form firing materials can be stored, for example, by stacking in the thickness direction.

In addition, such a support sheet-attached film-form firing material can be stored, for example, by winding one sheet of the material into a roll.

For example, the support sheet-attached film-form firing material provided with a protective film and having a band-shaped support sheet (e.g., the support sheet-attached film-form firing material 3) is particularly suitable for storing by winding one sheet (one strip) of the material into a reel-form.

That is, when the support sheet is band-shaped, step F2 above may be for winding the support sheet and the film-form firing materials (the support sheet-attached film-form firing material) after application of the protective film into a reel to store the material. In addition, step F3 above may be for unwinding the support sheet and the film-form firing materials after storage to which the protective film is applied (the support sheet-attached film-form firing material after storage) from the reel and then peeling off the protective film from the film-form firing material.

Figure 9:
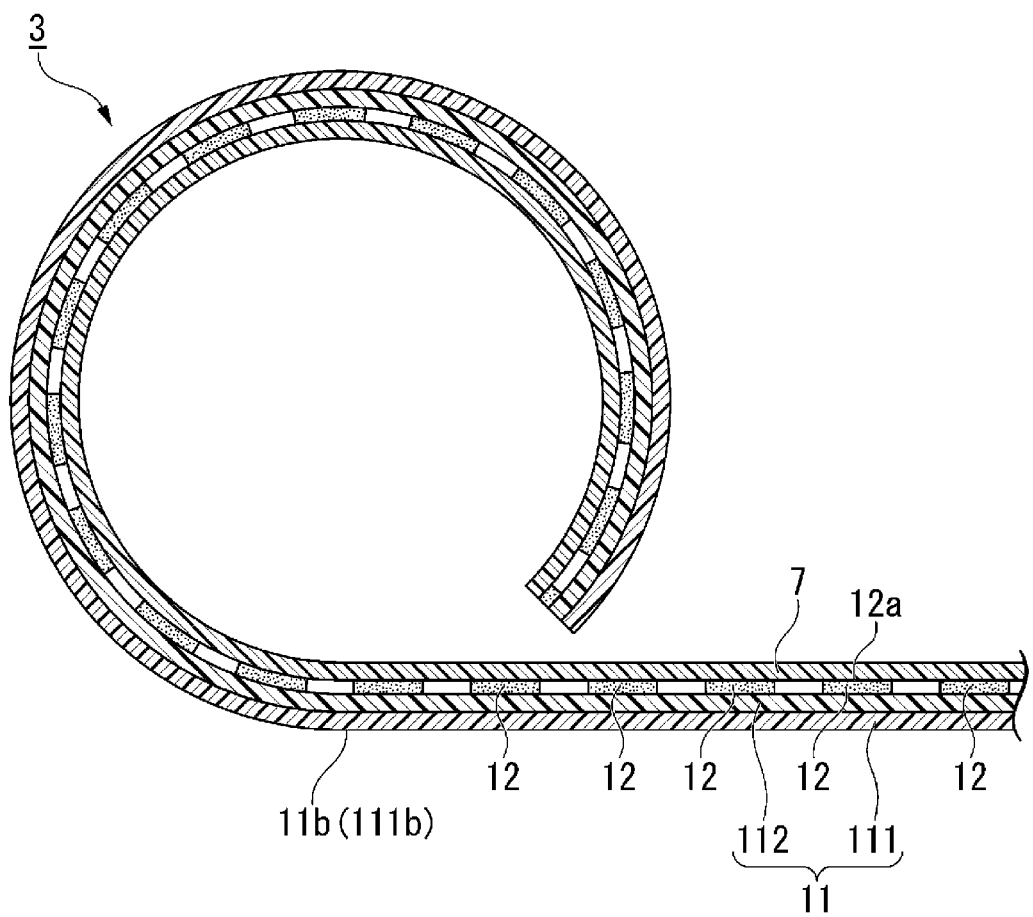
FIG. 9 is a cross-sectional view schematically illustrating an example of a support sheet-attached film-form firing material provided with a protective film, the material being unwound from a reel.

FIG. 9 is a cross-sectional view schematically illustrating an example of a support sheet-attached film-form firing material provided with a protective film, the material being unwound from a reel. Here, FIG. 8 illustrates a state where the support sheet-attached film-form firing material 3 provided with a protective film, the material in a reel-form, is being unwound.

The support sheet-attached film-form firing material 3 is wound in a reel with the exposed surface of the protective film 7 facing inward in the radial direction of the reel and the exposed surface (second surface 11b) of the support sheet 11 facing outward in the radial direction of the reel, with the support sheet 11 wound outwardly (in other words, with the protective film 7 wound inwardly).

Those obtained by bonding a plurality of support sheet-attached film-form firing materials having a quadrilateral-shaped or circle-shaped support sheet (e.g., the support sheet-attached film-form firing materials 1 or the support sheet-attached film-form firing materials 2) in the longitudinal direction to one strip (one sheet) of the band-shaped protective film (e.g., the protective film 7) (hereinafter referred to as the "band-shaped composite film") is also particularly suitable for storing by winding one strip of the film into a reel in the same manner as for the support sheet-attached film-form firing material having a band-shaped support sheet described above. Also in this case, this band-shaped composite film is wound into a reel with the exposed surface of the protective film facing inward in the radial direction of the reel and the exposed surface (second surface) of the support sheet facing outward in the radial direction of the reel, with the support sheet wound outwardly (in other words, with the protective film wound inwardly).

When a plurality of the support sheet-attached film-form firing materials is bonded to one strip of the band-shaped protective film in the longitudinal direction of the protective film, the plurality of the support sheet-attached film-form firing materials may be placed in one row or in two or more rows in the longitudinal direction of one strip of the protective film.

In addition, the plurality of the support sheet-attached film-form firing materials thus placed in a row(s) is preferably placed separated from each other.

In using the band-shaped composite film, step F1 above may be for applying the plurality of support sheets provided with the film-form firing materials (i.e., the plurality of support sheet-attached film-form firing materials) in a row(s) to one strip of the band-shaped protective film, via surfaces (first surfaces) of the film-form firing materials, the surfaces opposite from the support sheet side of the film-form firing materials. In addition, step F2 above may be for winding into a reel the band-shaped protective film to which the plurality of the support sheets provided with the film-form firing materials (the plurality of support sheet-attached film-form firing materials) is applied, and for storing the band-shaped protective film. Furthermore, step F3 above may be for unwinding from the reel the band-shaped protective film after storage to which the plurality of the support sheets provided with the film-form firing materials (the plurality of support sheet-attached film-form firing materials) is applied, and then peeling off the band-shaped protective film from the plurality of the film-form firing materials.

Regardless of the shape of the support sheet, step F1, step F2, and step F3 are performed in this order.

The application of the protective film to the film-form firing material(s) (application of the film-form firing materials to the protective film) in step F1, the storage of the support sheet-attached film-form firing material(s) in step F2, and peeling off of the protective film from the support sheet-attached film-form firing material(s) after storage in step F3 can all be performed by a known method.

Next, the method of manufacturing a laminate (which may be referred to as the "second embodiment" in the present specification) will be described by taking an example of using the support sheet 19 illustrated in FIG. 3A and FIG. 3B.

FIG. 10A to FIG. 10E are cross-sectional views for schematically illustrating an example of a method of manufacturing a laminate of the present embodiment.

Second Embodiment

Step A

Figure 10A:
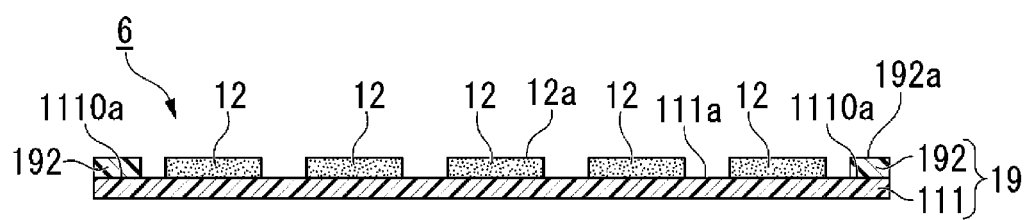
FIG. 10A is a cross-sectional view for schematically illustrating an example of a method of manufacturing a laminate of a second embodiment.

In step A, as illustrated in FIG. 10A, the film-form firing material 12 is provided on the support sheet 19 to produce a support sheet-attached film-form firing material 6.

As described above, in the support sheet 19, the pressure sensitive adhesive layer 192 is provided in the peripheral edge portion 1110a of the first surface 111a of the substrate film 111. In addition, in step A, more specifically, the film-form firing material 12 is provided in a region where the pressure sensitive adhesive layer 192 is not provided on the substrate film 111 of the support sheet 19 (the first surface 111a of the substrate film 111).

Step A in the second embodiment is the same as step A in the first embodiment except that the object provided with the film-form firing material 12 is different as described above.

For example, in step A of the second embodiment, as illustrated here, the film-form firing material 12 is preferably brought into direct contact with the first surface 19a of the support sheet 19.

Figure 11:
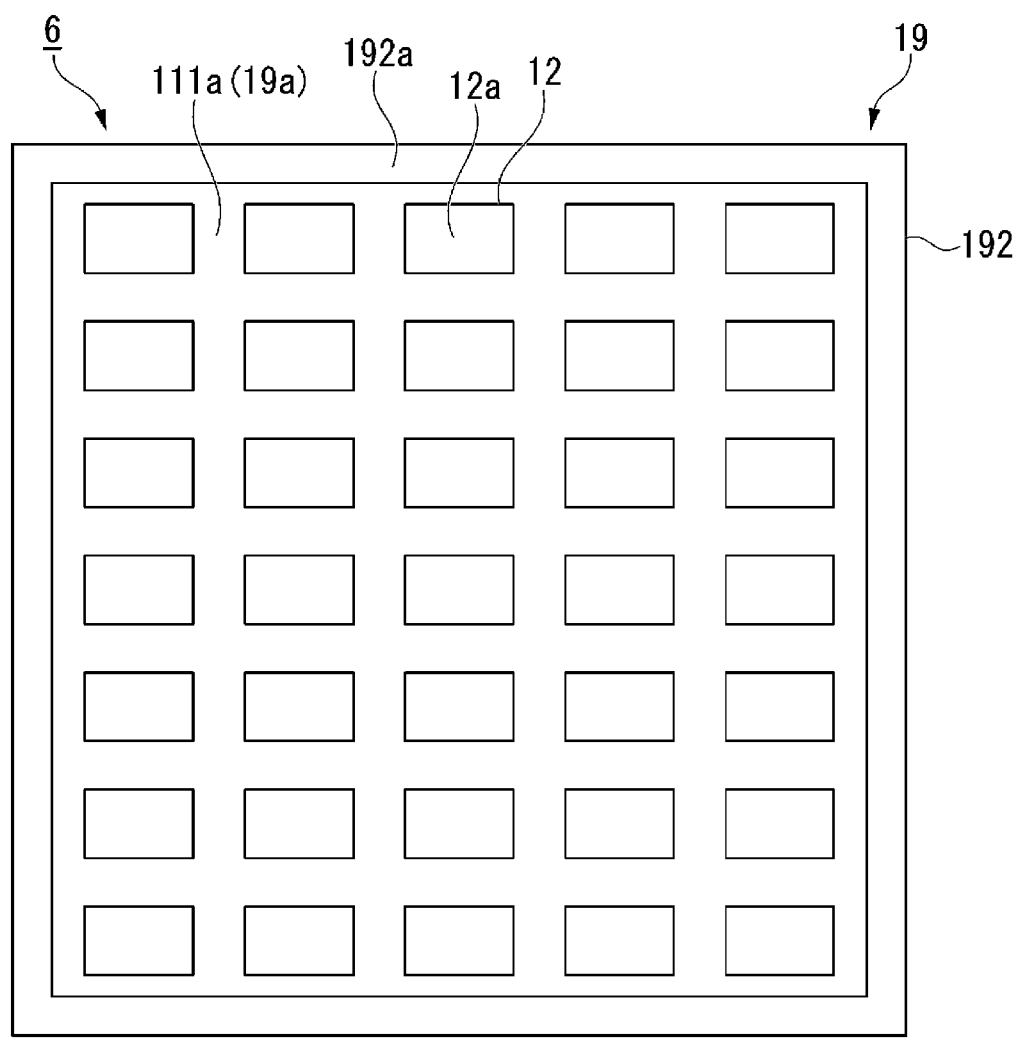
FIG. 11 is a plan view schematically illustrating an example of a support sheet-attached film-form firing material obtained by a method of manufacturing of the second embodiment.

FIG. 11 is a plan view schematically illustrating an example of the support sheet-attached film-form firing material 6 obtained by a method of manufacturing of the second embodiment.

The shape of the support sheet 19 illustrated here is quadrangular, and the film-form firing materials 12 are placed in a lattice pattern on the first surface 19a of the support sheet 19 in the same placement pattern as that in the support sheet-attached film-form firing material 1. However, all the film-form firing materials 12 are provided inside the pressure sensitive adhesive layer 192 on the support sheet 19 (in other words, in the center of gravity side of the support sheet 19).

A first surface 19a of the support sheet 19 is the same as the first surface 111a of the substrate film 111.

Step B

Step B is performed after step A.

Figure 10B:
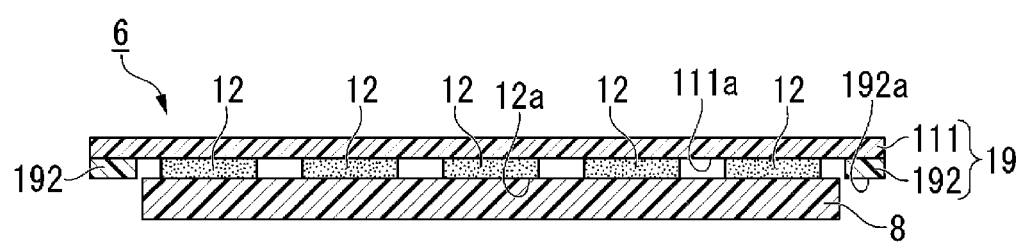
FIG. 10B is a cross-sectional view for schematically illustrating an example of the method of manufacturing a laminate of the second embodiment.

In step B, as illustrated in FIG. 10B, the film-form firing material 12 on the support sheet 19 is applied to a substrate 8.

Step B in the second embodiment is the same as step B in the first embodiment except that the support sheet-attached film-form firing material is different as described above.

However, unlike the support sheet 31, the support sheet 19 may or may not be suitable for being stored in a reel. Thus, unlike the case of using the support sheet-attached film-form firing material 3, when the support sheet-attached film-form firing material 6 is used, for example, some or all of the film-form firing materials 12 on the support sheet 19 may be preferably applied to the substrate 8 at different times from each other, or all of the film-form firing materials 12 on the support sheet 19 may be preferably simultaneously or substantially simultaneously applied to the substrate 8. The method of applying the film-form firing materials 12 can be selected according to, for example, the placement pattern of the film-form firing materials 12 on the support sheet 19.

In the second embodiment, in one or both of step A and step B, the support sheet 19 can be temporarily fixed to a support frame (not illustrated) by bonding the pressure sensitive adhesive layer 192 in the support sheet 19 to the support frame. In that case, the top of the first surface 192a of the pressure sensitive adhesive layer 192 is left open to avoid hinderance of bonding of the pressure sensitive adhesive layer 192 to the support frame.

When the pressure sensitive adhesive layer 192 has energy ray curability, the pressure sensitive adhesive layer 192 is preferably irradiated with an energy ray before the support sheet 19 fixed to the support frame is peeled off from the support frame. In this case, curing the pressure sensitive adhesive layer 192 by irradiation with an energy ray reduces the adhesive strength between a cured product of the pressure sensitive adhesive layer 192 and the support frame and thus enables the support sheet 19 to be more easily peeled off from the support frame.

Step C

Step C is performed after step B.

Figure 10C:
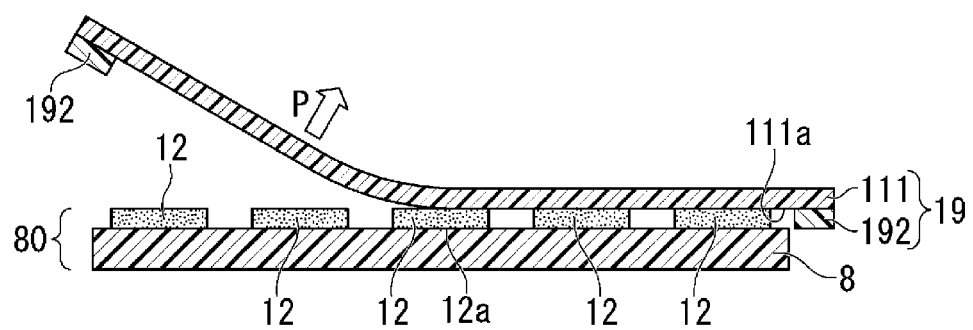
FIG. 10C is a cross-sectional view for schematically illustrating an example of the method of manufacturing a laminate of the second embodiment.

In step C, as illustrated in FIG. 10C, the support sheet 19 is peeled off from the substrate 8 and the film-form firing material 12 (i.e., the film-form firing material-attached substrate 80). When the support sheet 19 is peeled off, the film-form firing material 12 and the substrate 8 remain in a state of being bonded to each other and integrated as a single body.

Here, FIG. 10C illustrates a state of step C in a phase where the peeling off of some regions of the support sheet 19 from the film-form firing material-attached substrate 80 has not been completed.

Step C in the second embodiment is the same as step C in the first embodiment except that the support sheet-attached film-form firing material is different as described above.

However, in the second embodiment, the film-form firing material 12 is in contact with the substrate film 111 but not with the pressure sensitive adhesive layer 192, and thus, even if the pressure sensitive adhesive layer 192 has energy ray curability, curing the pressure sensitive adhesive layer 192 by irradiation with an energy ray does not enable the support sheet 19 to be more easily peeled off from the film-form firing material-attached substrate 80.

Step D and Step E

Step D is performed after step C, and step E is performed after step D.

Figure 10D:
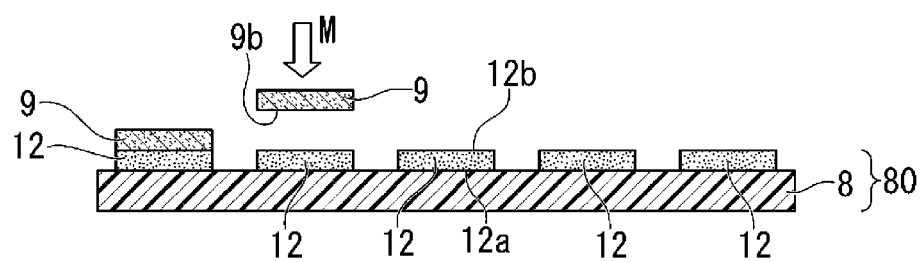
FIG. 10D is a cross-sectional view for schematically illustrating an example of the method of manufacturing a laminate of the second embodiment.

In step D, as illustrated in FIG. 10D, a back surface 9b side of the semiconductor chip 9 is applied to the film-form firing material 12 on the substrate 8 (in other words, the film-form firing material 12 in the film-form firing material-attached substrate 80) to face each other. At this time, the second surface 12b of the film-form firing material 12 and the back surface 9b of the semiconductor chip 9 are bonded together. Here, as in FIG. 4D, FIG. 10D also illustrates a state of step D in a phase where the application of some of the semiconductor chips 9 to the film-form firing material-attached substrate 80 has not been completed.

Figure 10E:
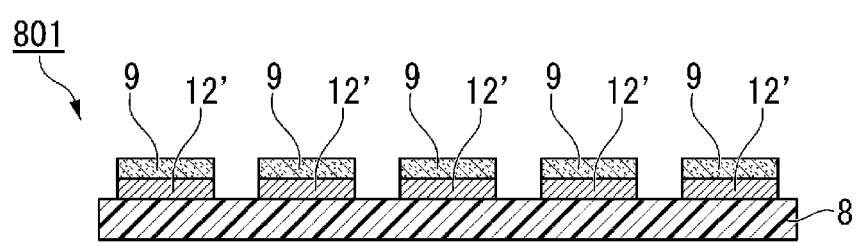
FIG. 10E is a cross-sectional view for schematically illustrating an example of the method of manufacturing a laminate of the second embodiment.

Then, in step E, the film-form firing material 12 is heated to 200° C. or higher to sinter-bond the semiconductor chip 9 and the substrate 8 as illustrated in FIG. 10E.

By performing step E, firing of the film-form firing material 12 results in formation of the joint portion 12' from the film-form firing material 12 and thus a laminate 801 having a configuration in which the semiconductor chip 9 and the substrate 8 are laminated via the joint portion 12' is provided.

In the second embodiment, step C described above provides the film-form firing material-attached substrate 80 in the same manner as in the first embodiment. Thus, step D of the second embodiment is the same as step D of the first embodiment, and step E of the second embodiment is the same as step E of the first embodiment.

Also in the second embodiment, the joint portion 12' is formed from the film-form firing material 12 and thus has excellent thickness stability and thermal conductivity. In addition, the film-form firing material 12 has an identical or substantially identical shape and an identical size to a shape and size of the semiconductor chip 9, and thus this eliminates the need to cut the film-form firing material 12 to the shape and size of the semiconductor chip 9. Thus, this eliminates the generation of cutting debris originating from the film-form firing material 12 even if the film-form firing material 12 is brittle, prevents damage to the film-form firing material 12, and forms a joint portion 12' free from damage.

The method of manufacturing of the second embodiment is not limited to those described so far and may be those in which one or some configurations are changed or deleted, or those in which another or other configurations are further added to those described so far within a scope not departing from the gist of the present invention. More specifically, those are as follows.

Also in the second embodiment, as in the first embodiment, the shape of the support sheet may be, for example, circular or band-like in addition to a quadrilateral. However, in all cases, as described above, all the film-form firing materials are provided inside the pressure sensitive adhesive layer on the support sheet (in other words, in the center of gravity side of the support sheet).

Also in the second embodiment, the support sheet-attached film-form firing material produced by performing step A is suitable for storage.

For example, a support sheet-attached film-form firing material further provided with a protective film on the first surface of the film-form firing material is particularly suitable for storage.

That is, the method of manufacturing of the second embodiment may include between step A and step B:

applying a protective film to a surface (first surface) of the film-form firing material, the surface opposite from the support sheet side of the film-form firing material (step F1);

storing the support sheet and film-form firing material (the support sheet-attached film-form firing material) after application of the protective film (step F2); and peeling off the protective film from the film-form firing material on the support sheet to which the protective sheet has been attached after storage (the support sheet-attached film-form firing material after storage) (step F3).

Step F1, step F2, and step F3 in the second embodiment are the same as step F1, step F2, and step F3 in the first embodiment except that the support sheet used is different.

In step F1 of the second embodiment, the protective film may or may not be applied not only to the first surface of the film-form firing material but also to the first surface of the pressure sensitive adhesive layer (e.g., the first surface 192a of the pressure sensitive adhesive layer 192).

The support sheet-attached film-form firing material provided with a protective film in the second embodiment (e.g., the support sheet-attached film-form firing material 6) can be stored by the same method as for the support sheet-attached film-form firing material provided with a protective film in the first embodiment (e.g., the support sheet-attached film-form firing material 1 to 3).

INDUSTRIAL APPLICABILITY

The present invention can be utilized for manufacturing power semiconductor elements (power devices).

REFERENCE SIGNS LIST 1, 2, 3, 6 • • • Support sheet-attached film-form firing material
11, 19, 21, 31 • • • Support sheet
11a, 19a, 21a, 31a • • • First surface of support sheet
111, 311 • • • Substrate film
111a, 311a • • • First surface of substrate film
112, 212, 192, 312 • • • Pressure sensitive adhesive layer
112a, 212a, 192a, 312a • • • First surface of pressure sensitive adhesive layer
12 • • • Film-form firing material
12a • • • First surface of film-form firing material
12b • • • Second surface of film-form firing material 12
12' • • • Joint portion
8 • • • Substrate
9 • • • Semiconductor chip
9b • • • Back surface of semiconductor chip 9
80 • • • Film-form firing material-attached substrate
801 • • • Laminate

The invention claimed is:

1. A method of manufacturing a laminate, the method comprising:
   providing a film-form firing material on a support sheet, the film-form firing material containing sinterable metal particles and a binder component and having an identical or substantially identical shape and an identical size to a shape and size of a semiconductor chip to be applied;
   applying, to a substrate, the film-form firing material on the support sheet;
   peeling off the support sheet from the substrate and the film-form firing material;
   applying a back surface side of the semiconductor chip to the film-form firing material on the substrate to face each other; and
   after the support sheet has been peeled from the substrate and the film-form firing material, sinter-bonding the semiconductor chip and the substrate by heating the film-form firing material to 200° C. or higher.

2. The method of manufacturing a laminate according to claim 1, wherein the method includes sinter-bonding the semiconductor chip and the substrate by applying pressure of 5 MPa or greater to the film-form firing material in addition to heating the film-form firing material to 200° C. or higher.

3. The method of manufacturing a laminate according to claim 1, wherein the substrate is a ceramic substrate.

4. The method of manufacturing a laminate according to claim 1, wherein the support sheet comprises a substrate film and a pressure sensitive adhesive layer provided on an entire surface on the substrate film, and the film-form firing material is provided on the pressure sensitive adhesive layer of the support sheet.

5. The method of manufacturing a laminate according to claim 1, wherein the support sheet comprises a substrate film and a pressure sensitive adhesive layer provided in a peripheral edge portion on the substrate film, and the film-form firing material is provided in a region where the pressure sensitive adhesive layer is not provided on the substrate film of the support sheet.

6. The method of manufacturing a laminate according to claim 4, wherein the pressure sensitive adhesive layer has energy ray-curability.

7. The method of manufacturing a laminate according to claim 6, wherein the pressure sensitive adhesive layer is irradiated with an energy ray and the support sheet is peeled off from the film-form firing material.

8. The method of manufacturing a laminate according to claim 1, wherein the film-form firing material formed on a release film is transferred onto the support sheet to provide the film-form firing material on the support sheet.

9. The method of manufacturing a laminate according to claim 8, wherein the film-form firing material is formed on the release film by printing.

10. The method of manufacturing a laminate according to claim 8, wherein the film-form firing material is formed on the release film by punching using a mold having an identical or substantially identical shape and an identical size to a shape and size of the semiconductor chip to be applied.

11. The method of manufacturing a laminate according to claim 1, wherein the film-form firing material is provided on the support sheet by printing.

12. The method of manufacturing a laminate according to claim 1, wherein the support sheet is circular.

13. The method of manufacturing a laminate according to claim 1, wherein the support sheet can be wound into a reel, and the film-form firing materials are provided side-by-side at regular intervals on the support sheet.

14. The method of manufacturing a laminate according to claim 1, wherein the sinter bonding is applied to a precursor of the laminate consisting of the substrate, the film-form firing material, and the semiconductor chip.

* * * * *